(12) United States Patent
Savoir et al.

(10) Patent No.: US 10,884,044 B1
(45) Date of Patent: Jan. 5, 2021

(54) METHOD OF DETECTING UNAUTHORIZED DEVICES INSTALLED ON ELECTRICAL INTERFACES OF VEHICLES

(71) Applicant: OCEANSHIELD PTE LTD, Singapore (SG)

(72) Inventors: Jonathan Erik G. Savoir, Singapore (SG); Mikhail Solomon Zeldovich, Singapore (SG); Alexey Sergeevich Pronichkin, Dmitrovograd (RU); Dmitry Mikhaylovich Mikhaylov, Moscow (RU)

(73) Assignee: OCEANSHIELD PTE LTD, Singapore (SG)

( * ) Notice: Subject to any disclaimer, the term of this patent is extended or adjusted under 35 U.S.C. 154(b) by 0 days.

(21) Appl. No.: 16/580,933

(22) Filed: Sep. 24, 2019

(51) Int. Cl.
*G01R 27/16* (2006.01)

(52) U.S. Cl.
CPC .................................... *G01R 27/16* (2013.01)

(58) Field of Classification Search
CPC ........ G01R 27/16; G01R 27/26; G01R 27/02; G01R 27/08
USPC ................. 324/525, 600, 683, 709
See application file for complete search history.

(56) References Cited

U.S. PATENT DOCUMENTS

| | | | |
|---|---|---|---|
| 6,211,753 B1 * | 4/2001 | Leifso | H03H 11/48 327/110 |
| 7,555,787 B2 * | 6/2009 | Clercq | G06F 9/3017 726/34 |
| 8,955,130 B1 * | 2/2015 | Kalintsev | G06F 21/567 726/23 |
| 9,401,923 B2 * | 7/2016 | Valasek | H04L 63/1408 |
| 9,491,197 B2 * | 11/2016 | Adachi | H04L 63/20 |
| 9,661,006 B2 * | 5/2017 | Kantor | G06F 21/606 |

(Continued)

FOREIGN PATENT DOCUMENTS

| | | | | |
|---|---|---|---|---|
| CA | 2960343 A1 | 9/2017 | | |
| WO | WO-2018146845 A1 * | 8/2018 | ............. | G06F 13/00 |
| WO | WO-2019049285 A1 * | 3/2019 | ............. | H04L 12/28 |

OTHER PUBLICATIONS

WO-2018146845-A1 WIPO English Translation. (Year: 2020).*

*Primary Examiner* — Patrick Assouad
*Assistant Examiner* — Sean Curtis
(74) *Attorney, Agent, or Firm* — BCF LLP (57) ABSTRACT

This invention relates to cybersecurity enforcement in vehicle control systems, more specifically, to the protection of electrical interfaces as components of such control systems. The method of detecting unauthorized devices installed on electrical interfaces of vehicles comprises measuring the impedances (the reactive and the active resistances) of the electrical interface at the initial moment of time and subsequently. The measurement of the active component of the electrical interface resistance comprises the measurement of the current and voltage of the devices connected to the electrical interface followed by the calculation of the total resistance of all the devices. The measurement of the reactive component of the electrical interface resistance comprises the measurement of the capacitance component of the electrical interface resistance by the impedance spectroscopy method. The technical result of the invention disclosed herein is the prevention and elimination of the threat option, more specifically, the installation of unauthorized devices on electrical interfaces.

11 Claims, 5 Drawing Sheets

(56) References Cited

U.S. PATENT DOCUMENTS

| | | | |
|---|---|---|---|
| 10,002,258 B2 * | 6/2018 | Litichever | G06F 21/604 |
| 10,361,934 B2 * | 7/2019 | Elend | H04L 43/08 |
| 10,410,002 B1 * | 9/2019 | Jenkins | H04L 63/123 |
| 10,698,752 B2 * | 6/2020 | Kurian | G06F 11/3037 |
| 2008/0018340 A1 * | 1/2008 | Arnou | G01R 27/16 |
| | | | 324/525 |
| 2014/0380416 A1 * | 12/2014 | Adachi | H04L 63/20 |
| | | | 726/2 |
| 2020/0233019 A1 * | 7/2020 | Atobe | G06F 11/3058 |

\* cited by examiner

METHOD OF DETECTING UNAUTHORIZED DEVICES INSTALLED ON ELECTRICAL INTERFACES OF VEHICLES

This invention relates to cybersecurity enforcement in vehicle control systems, more specifically, to the protection of electrical interfaces as components of such control systems.

Cybersecurity enforcement in electronic/intellectual systems is becoming a major issue of utmost importance in the $21^{st}$ century. The rate of social development in the IT domain increases permanently. The digitalization of various processes, the use of computers for solving tasks of any complexity and so on are the paces toward the development of an information society. The increase in the number of control systems helping us to solve various tasks leads to the proportional increase in the number of potential threats aimed at causing harm/damage. To that end the intruders increasingly use the software or hardware vulnerabilities of vehicle control systems. Cybersecurity enforcement implies the elimination of such kind of threats and providing system protection.

Currently known from the art are solutions which to a greater or lesser extent solve cybersecurity enforcement issues for control systems of various types of vehicles.

By way of example we can refer to U.S. Pat. No. 10,002,258B2 published on 19 Jun. 2018 (Security System and Method for Protecting a Vehicle Electronic System). Said Patent teaches the installation of a Getaway/Bridge type device. The main purpose of said device is to monitor the messages transmitted via electrical interfaces and to filter such messages subject to the fulfillment of special conditions. However, said solution is only applicable for land transport vehicles.

Another vehicle cybersecurity enforcement method is taught in Patent CA2960343A1 published on 22 Sep. 2017 (Aircraft Message Management System). Said solution uses a different cybersecurity enforcement approach, more specifically, message filtering in aircraft onboard electronic systems. The main operations performed with the messages are as follows: receipt, authorization, identification, processing and generation.

Said known technical solutions do not teach electrical interface hardware protection embodiments.

U.S. Pat. No. 8,955,130 published on 10 Feb. 2015 (Method for Protecting Vehicle Data Transmission System from Intrusions) teaches CAN electrical interface protection method embodiments for vehicles such as cars. Said solution provides a general description of CAN electrical interface protection embodiments for cars while not disclosing methods of implementing said function.

The object of the invention disclosed herein is to provide intrusion protection of vehicle electronic control systems (cybersecurity).

The technical result of this invention is the prevention and elimination of the threat option, more specifically, the installation of unauthorized devices on electrical interfaces.

Unauthorized devices installed on electrical interfaces may gain full access to data exchanged between devices via an electrical interface. Such data can be forwarded to the intruders for further analysis. One can consider the most hazardous type of intrusion as the option when an unauthorized device installed on the interface (a bug) generates a command in the electrical interface to perform a specific operation (as an option, to start or stop a specific mechanism).

Below are some examples of intrusions aimed at influencing vehicles, and their potential consequences:
  Disabling the operation of the engine control unit: crashing with another vehicle;
  Substitution of geographic coordinates: loss of time and resources for returning to the original vehicle route;
  Rendering vehicle control system modules inoperable: crashing with infrastructure facilities, potential human casualties;
  etc.

Thus, in order to prevent such type of intrusions it is quite desirable to use methods providing cybersecurity of vehicles at the hardware level.

This invention describes a method of detecting unauthorized devices installed on electrical interfaces by comparing the current electrical impedance with the initial impedance value.

The invention disclosed herein describes a method of detecting the unauthorized installation of devices on electrical interface lines for data transmission and management (hereinafter, electrical interfaces) that are used in vehicles for providing control systems. For the purposes of this description, vehicles will be considered as any type of vehicle in which one system or all the control systems are electronic, and data transmission within said system or between said system and external devices is provided via dedicated electrical interfaces. Such vehicles include land transport vehicles, underground vehicles, aircrafts and water transport vehicles (marine/river). The electrical interface is considered as the totality of means and methods of interaction between the components of the control system. The components of the control system are electrical modules/units/devices.

For any electrical interface, one can define the scope of parameters distinguishing said interface from other interfaces:
  Mechanical (connectors, types of cable communications);
  Electrical (logical levels);
  Functional descriptions (transfer protocols).

The method described herein comprises analysis of electrical parameters (data acquisition, processing, comparison and storage). These operations are aimed at detecting the installation of an unauthorized device on the interface communication line of the electrical interface.

The method described herein can be used for any type (subtype) of existing electrical interfaces. One should distinguish 2 main types of electrical interfaces based on the device connection topology: parallel and serial. In vehicles, serial electrical interfaces are mainly used, along with the following standards: CAN, CAN FD, LIN, Ethernet, NMEA-0183, NMEA-2000, RS-485/422/232 etc. Noteworthy, said interfaces use differential pairs of conductors as data transmission lines. The use of said embodiment is necessitated by the objective to provide high noise protection of the differential signal compared with general signal types. The method described herein and its use are not restricted to vehicles only; the principles described can also be used in other systems finding general applications.

This invention is illustrated by figures, where.

Figure 1:
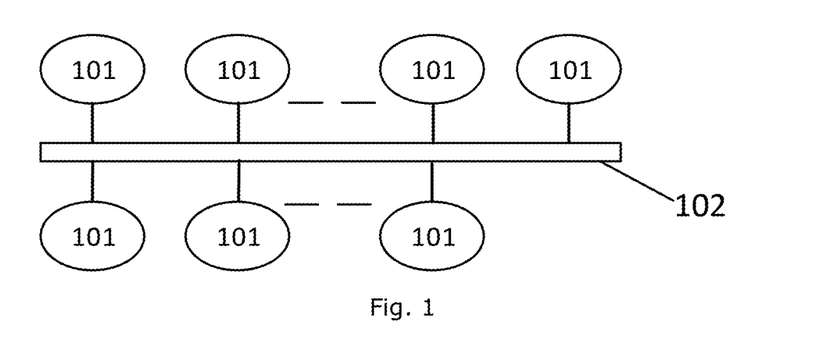
FIG. 1: general interconnection diagram of electrical devices for data exchange in vehicle control systems.

The installation of a new device on the electrical interface is considered as the installation of an unauthorized device (bug). FIG. 1 presents a general interconnection diagram of electrical devices for data exchange in vehicle control systems. The devices 101 are connected to the electrical interface 102 via conductors, typically, with a connector. The quantity of the devices 101 can be arbitrary. Depending on the interface type or the data exchange standard used, each device can perform the prescribed operation (for example, being master or slave). The impedance measurement method as described hereinafter is equally suited for any types of interfaces in which a differential pair is used as communication line (CAN, CAN FD, LIN, Ethernet, NMEA-0183, NMEA-2000, RS-485/422/232 etc.).

Figure 2:
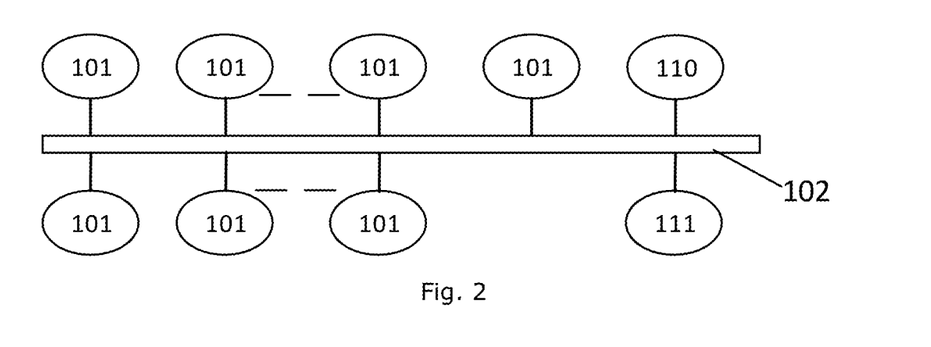
FIG. 2: unauthorized device (bug) connection option to a vehicle control system.

FIG. 2 shows the unauthorized device (bug) 110 connection option to the electrical interface 102 and the connection of the device 111 implementing the impedance measuring method. Each device connected to the electrical interface is an integrated circuit providing for the generation of a signal the electrical parameters of which meet the preset requirements. Each driver has an individual internal impedance value. Therefore the number of the connected devices (the quantity of the drivers) affects the total impedance of the electrical interface.

Figure 3:
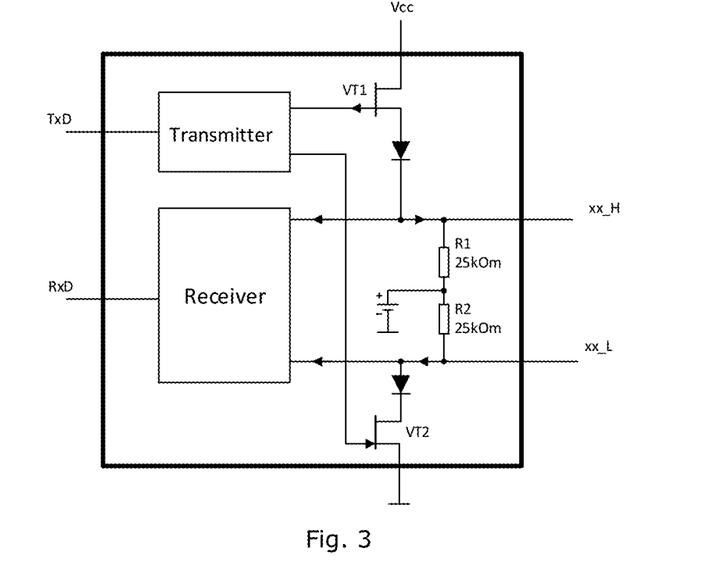
FIG. 3: functional electrical diagram of the integral driver of an electrical interface.

FIG. 3 illustrates a simplified electrical diagram of the integral driver of an electrical interface. This electrical diagram will be identical for drivers installed on different options of interfaces (which use a differential pair). Therefore the impedance measurement method described herein can be as well used for any other interfaces which use a differential pair as communication line. In FIG. 3, the driver outputs xx_H and xx_L are connected to the respective lines of the electrical interface of the vehicle control system. The impedance is measured in the absence of data exchange via the electrical interface. In this mode the field transistors VT1 and VT2 are closed.

Figure 4:
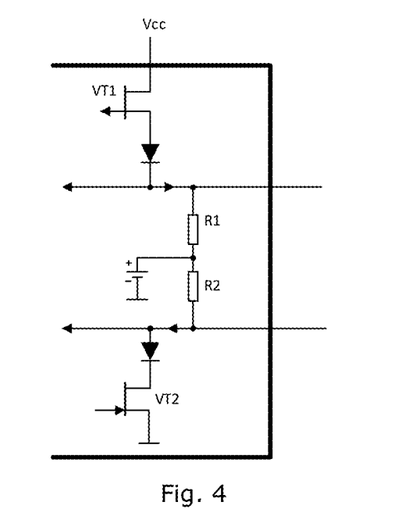
FIG. 4: output path of an electrical interface driver.

FIG. 4 presents separately the output path of the driver for which further calculation will be performed. There is no sense to consider the RECEIVER unit (see FIG. 3) which is a combination of logical inputs of a complementary metal/oxide/semiconductor (CMOS) structure, because the input resistance of this unit is of the order of MOhms. FIG. 4 also shows the pair of resistors R1 and R2, the resistance of each being of the order of decades kOhms. These resistors are the equivalent resistances of the closed channels of the field transistors VT1 and VT2. The normal resistance of the terminal resistors installed on electrical interfaces is Rt1=Rt2=120 Ohm.

Figure 5:
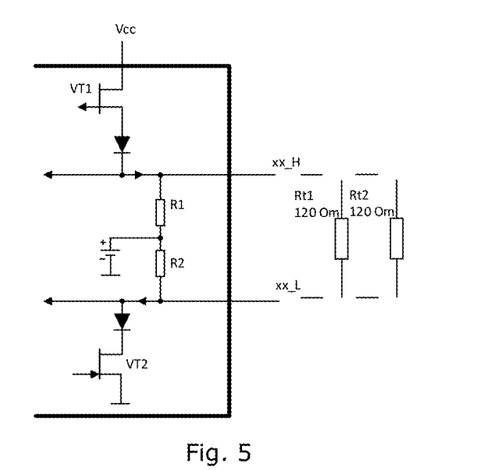
FIG. 5: simplified presentation of the output path of an electrical interface driver with field transistors replaced for their closed-channel resistances.

FIG. 5 shows a simplified equivalent electrical diagram of the output path of the electrical interface driver with the field transistors VT1 and VT2 replaced for their closed-channel resistances. This simplification is justified because in the absence of the control signal at the output path transistors (VT1 and VT2) their resistance is of the order of several MOhms, and therefore their contribution to the total circuit resistance will be negligible.

Figure 6:
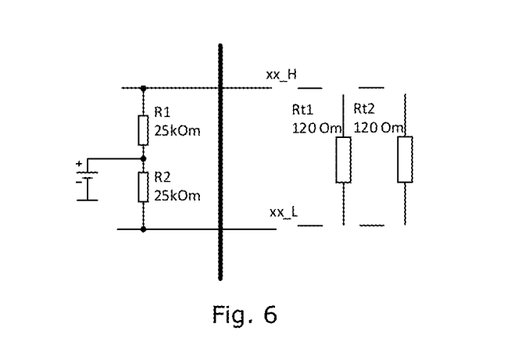
FIG. 6: simplified electrical diagram of the output path of an electrical interface driver with transistor channel resistances excluded.

FIG. 6 shows a simplified diagram of the output path of the electrical interface driver with the transistor channel resistances excluded. In this Figure the resistance of the serial connected terminal resistors is 60 Ohm (see Eq. 1).

$$R_{ter} = \frac{R_{t1} * R_{t2}}{R_{t1} + R_{t2}} = \frac{120 \text{ Ohm}}{2} = 60 \text{ Ohm} \quad (1)$$

This resistance can be neglected during the calculation of the total resistance because the resistances R1 and R2 are decades of KOhms. It is therefore safe to assume that the outputs of the electrical interface xx_H and xx_L are interconnected.

Figure 7:
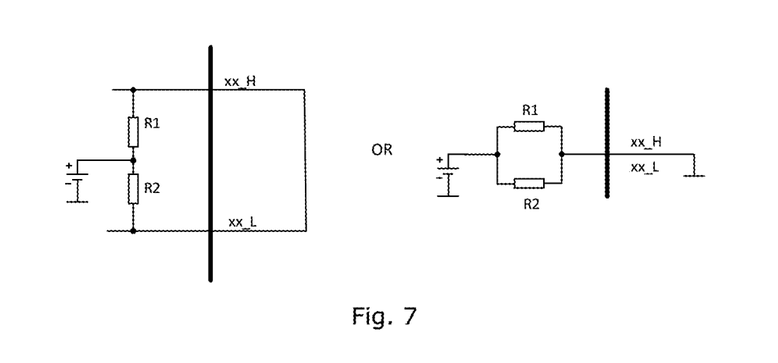
FIG. 7: simplified electrical diagram with terminal resistors excluded.

FIG. 7 shows a simplified electrical diagram with the terminal resistors excluded. We therefore can conclude that any electrical interface with a differential signal is connected via a serial circuit of two resistors to the ground (common wire). The internal resistance of the power unit tends to zero.

Figure 8:
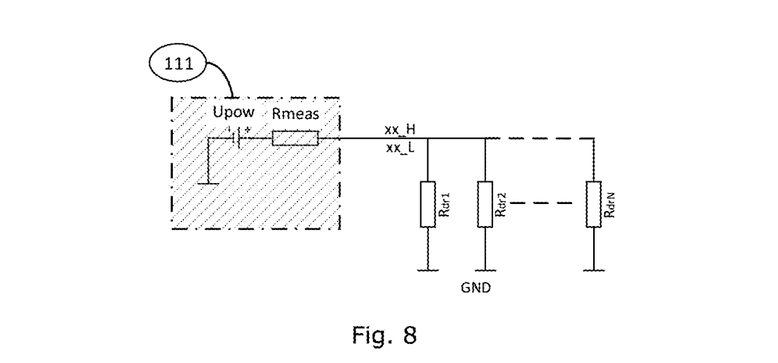
FIG. 8: equivalent resistance circuit for electrical interface resistance active component measurement.

FIG. 8 presents an equivalent resistance circuit for the measurement of the electrical interface resistance active component. Here Rdr1, Rdr2 . . . RdrN are the internal active resistances of the device drivers connected to the electrical interface. The device 111 is connected to the electrical interface for the implementation of the impedance measurement method. Rmeas is the resistance used as reference for the measurement, and Upow is the power unit.

Figure 9:
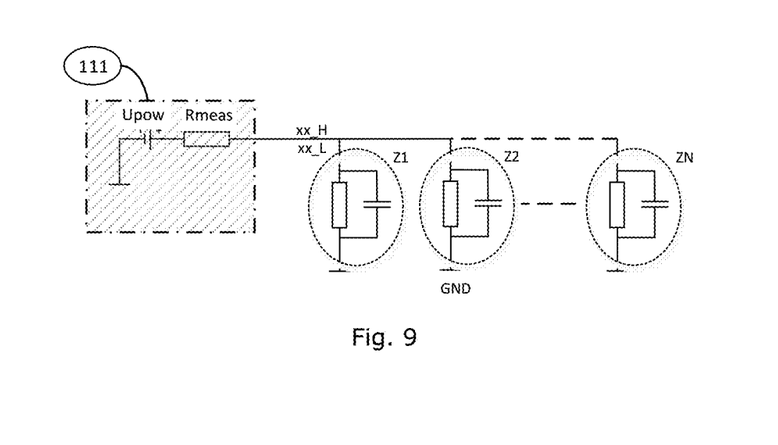
FIG. 9: equivalent resistance circuit for electrical interface resistance reactive component measurement.

FIG. 9 illustrates an equivalent resistance circuit for the measurement of the electrical interface resistance reactive component. Here Z1, Z2 . . . ZN are the internal reactive resistances of the device drivers connected to the electrical interface. The device 111 is connected to the electrical interface for the implementation of the impedance measurement method. Rmeas is the resistance used as reference for the measurement, and Upow is the power unit.

The measurements will be carried out hereinafter for the circuits presented (FIGS. 8 and 9).

The impedance measurement includes two stages:

Measurement of the active resistance component;

Measurement of the reactive resistance component.

For the measurement of the active resistance component, the electrical interface line is fed by direct voltage (via the internal power unit Upow) which generates electrical current. The magnitude of this current is inversely proportional to the active resistance of the drivers connected to the electrical interface. The general formula for the calculation of the circuit shown in FIG. 8 is presented below (Eq. 2).

$$U_{R_{meas}} = R_{meas} \cdot \frac{U_{pow}}{R_{meas} + \frac{1}{\frac{1}{R_{dr1}} + \frac{1}{R_{dr2}} + \ldots + \frac{1}{R_{drN}}}}; \quad (2)$$

The current and the voltage are measured and further used for the calculation of the total resistance of all the devices (drivers) connected to the electrical interface.

The measured active resistance is stored in the memory for further analysis. These measurements are carried out at the initial moment of time and subsequently. The value obtained initially is used as reference.

The reactive resistance of the electrical interface line is also measured and stored in the memory for each electrical interface. The equivalent circuit is presented in FIG. 9.

The reactive component of the total impedance is mainly of a capacitance origin. The measured reactive (capacitance) component (relative to the ground) may be several decades of pF or greater. The impedance spectrometry method is used for the measurement of the nominal reactive (capacitance) component of the electrical interface impedance. For the measurement of the nominal reactive (capacitance) component of the electrical interface impedance, the circuit is connected to the power unit (Upow). The power unit acts to phase-shift the voltage applied to the equivalent resistance of the electrical interface drivers and the current in the electrical interface.

Measuring the phase shift allows evaluating the reactive component of the electrical interface resistance. This value is inversely proportional to the phase shift value.

Figure 10:
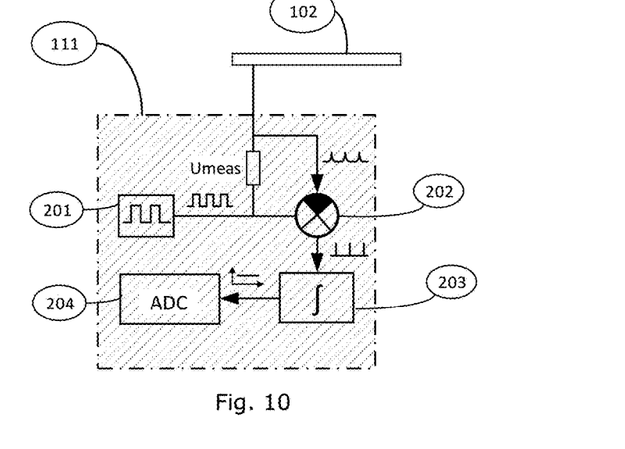
FIG. 10: electric block diagram of measuring reactive (capacitance) component of the electrical interface by the impedance spectrometry method.

FIG. 10 shows a logical diagram of the device for measuring reactive (capacitance) component of the electrical interface by the impedance spectrometry method. The impedance measuring device 111 is connected to the electrical interface 102 to which other devices that interchange data were connected earlier. The impedance measuring device 111 comprises the clock generator unit 201 the function of which is pulse generation (with different pulse period, rate and amplitude) and delivery to the electrical interface 102. The pulses passing via the measuring resistor Rmeas connected in series with the electrical interface form the voltage drop at the resistor, proportionally to the current through the resistor resulting from these pulses. The greater the reactive component of the electrical interface 102, the greater the difference between the current pulse shape and the voltage pulse shape (edge roll-off and phase shift). Two voltages are supplied to the outputs of the phase shift calculator 202 directly from the clock generator 201 and from the measuring resistor Rmeas. The shift calculator 202 generates pulses the length of which is proportional to the phase shift between these voltages (between the voltage and the current). The generated pulses are further delivered to the integrator 203. The function of the integrator is to integrate the pulses delivered to its input and form voltage with the amplitude proportional to the number and length of the input pulses. Following the integrator 203 the voltage is delivered to the input of the analog to digital converter 204 (ADC) where it is digitalized and can be used for further calculations.

Figure 11:
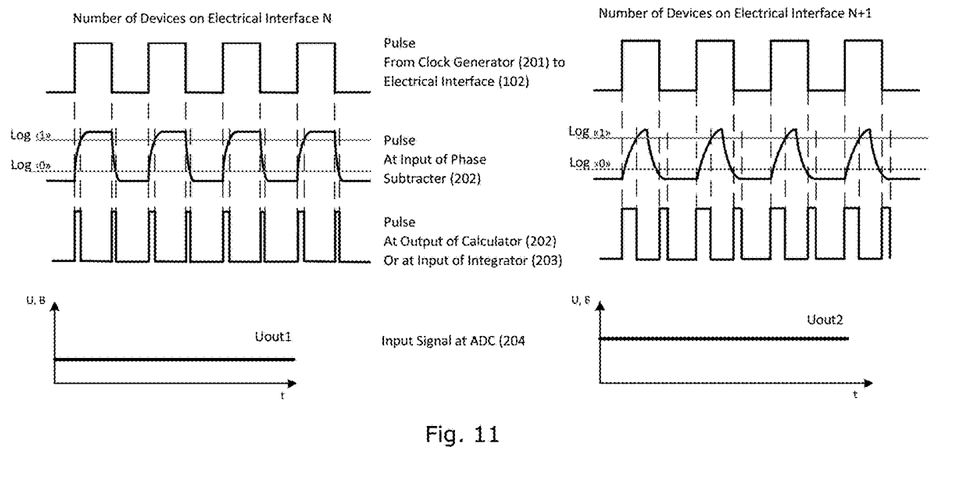
FIG. 11: visualization of signals (impulses) on oscilloscope during execution of electric block diagram.

FIG. 11 shows the diagrams of pulse propagation via each of the units of the impedance measuring device 111 during the measurement of the reactive (capacitance) resistance by the impedance spectroscopy method. Two diagram options are presented. One diagram option shows the initial signal shape when the electrical interface does not contain any unauthorized devices (bugs) installed on it (the number of the devices is N). The second diagram option shows the case of installation of unauthorized devices (the number of the devices is N+1).

This method is used for the calculation of the reactive (capacitance) resistance component of the electrical interface. This value is also stored in the memory for further processing and analysis.

If additional unauthorized devices (bugs) are connected that influence the operation of the vehicle electrical interface the measured values change abruptly (in a stepwise manner). This allows concluding on the unauthorized connection of a device (additional driver).

One should also note that the equivalent impedance of an electrical interface is most largely influenced if the number of the devices (drivers) connected to the electrical interface is the smallest. Thus an increase in the number of the connected devices (drivers) leads to a decrease in the change of the equivalent impedance as additional devices (drivers) are connected.

For example, taking the equivalent resistance of one device (driver) as reference Rdr=125 Ohm one can calculate the change in the total electrical resistance of the electrical interface as additional drivers are connected.

Table 1 illustrates the calculation of the equivalent resistance of the electrical interface for the connection of different number of devices (drivers). It can be seen from Table 1 that upon the connection of the 30$^{th}$ driver the resistance will decrease by 14.3 Ohm. Therefore a required parameter for ensuring the authenticity of the measurements and reliable detection of unauthorized connections to the electrical interface is the maximum allowed number of devices connected to the same bus.

TABLE 1

Calculation of Equivalent Bus Resistance upon Drivers Connection

| Bus Resistance, Ohm | No. Of Drivers. |
|---|---|
| 12500,0 | 1 |
| 6250,0 | 2 |
| 4166,7 | 3 |
| 3125,0 | 4 |
| 2500,0 | 5 |
| 2083,3 | 6 |
| 1785,7 | 7 |
| 1562,5 | 8 |
| 1388,9 | 9 |
| 1250,0 | 10 |
| 892,9 | 14 |
| 833,3 | 15 |
| 781,3 | 16 |
| 625,0 | 20 |
| 595,2 | 21 |
| 500,0 | 25 |
| 480,8 | 26 |
| 431,0 | 29 |
| 416,7 | 30 |

Figure 12:
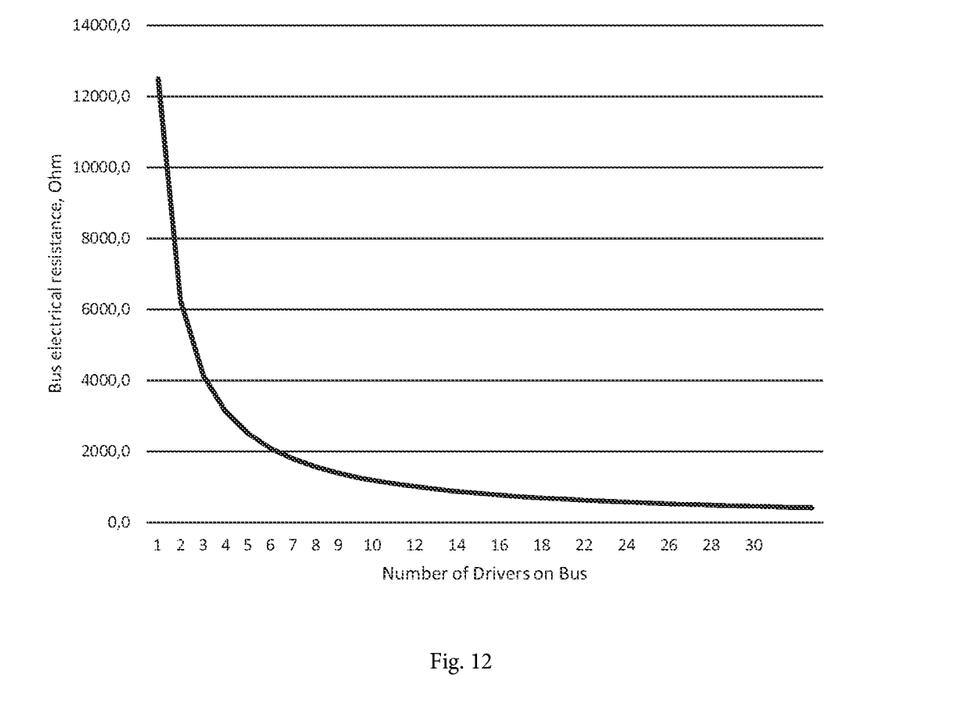
FIG. 12: measuring of electrical interface equivalent resistance in case of increasing the number of connected devices (drivers), The invention disclosed herein teaches the method of measuring the initial impedances (active and reactive resistances) of electrical interfaces and storing the result in the memory. Thereafter the stored value will be used as reference for detecting potential installation of a new device on the electrical interface.

FIG. 12 provides a graphical presentation of the measurement of the equivalent resistance of an electrical interface in case of increasing the number of connected devices (drivers).

What is claimed is:

1. A method for detecting a connection of an unauthorized electronic device to an electrical interface of a vehicle, the electrical interface for connecting a plurality of control electronic devices to the vehicle, the plurality of control electronic devices for providing control to the vehicle, the method being executable by a measuring device communicatively coupled to the vehicle via the electrical interface, the method comprising: at a first moment in time, determining, by the measuring device, a first value of a total electrical impedance of the electrical interface, the determining the first value of the total electrical impedance of the electrical interface being based on internal impedance values associated with the plurality of control electronic devices connected thereto, wherein for each one of the plurality of control electronic devices, a respective internal impedance value has been predetermined; at a second moment in time after the first moment in time, determining, by the measuring device, a second value of the total electrical impedance of the electrical interface, the determining the second value of the total electrical impedance of the electrical interface being based on internal impedance values associated with each electronic device connected thereto; in response to the second value of the total electrical impedance being different from the first value of the total electrical impedance, determining that the unauthorized electronic device is being connected to the electrical interface of the vehicle.

2. The method of claim 1, wherein the electrical interface is used for providing a data exchange between each of the plurality of control electronic devices and the vehicle, and wherein the determining the first value of the total impedance of the electrical interface is executed when the data exchange is disabled.

3. The method of claim 1, wherein the electrical interface comprises one of a serial electrical interface and a parallel electrical interface.

4. The method of claim 3, wherein the electrical interface further comprises one of CAN, CAN FD, LIN, Ethernet, NMEA-0183, NMEA-2000, RS-485, RS-422, and RS-232.

5. The method of claim 1, wherein the determining any one of the first value and the second value of the total electrical impedance of the electrical interface further comprises determining an active impedance component and a reactive impedance component of the electrical interface.

6. The method of claim 5, wherein the determining the active impedance component comprises determining a voltage and a current associated with each electronic device connected to the electrical interface.

7. The method of claim 5, wherein the determining the reactive impedance component comprises determining a capacitance impedance of the electrical interface.

8. The method of claim 7, wherein the determining the capacitance impedance further comprises determining a phase shift between a voltage and a current applied to the electrical interface.

9. The method of claim 8, wherein the capacitance impedance of the electrical interface is inversely proportional to the phase shift.

10. The method of claim 8, wherein the determining the phase shift between the voltage and the current applied to the electrical interface further comprises:
generating electrical pulses for delivery thereof to the electrical interface; determining a pulse duration associated with the electrical pulses, the pulse duration being proportional to the phase shift.

11. The method of claim 1, wherein the first value of the total electrical impedance of the electrical interface is a reference value thereof.

* * * * *